United States Patent
Lee

(10) Patent No.: US 11,964,471 B2
(45) Date of Patent: Apr. 23, 2024

(54) SUBSTRATE TREATING APPARATUS AND SUBSTRATE TREATING METHOD USING THE SAME

(71) Applicant: SEMES CO., LTD., Chungcheongnam-do (KR)

(72) Inventor: Dong Yun Lee, Chungcheongnam-do (KR)

(73) Assignee: SEMES CO., LTD., Cheonan-si (KR)

( * ) Notice: Subject to any disclaimer, the term of this patent is extended or adjusted under 35 U.S.C. 154(b) by 0 days.

(21) Appl. No.: 17/949,213

(22) Filed: Sep. 21, 2022

(65) Prior Publication Data

US 2023/0133599 A1    May 4, 2023

(30) Foreign Application Priority Data

Oct. 29, 2021    (KR) .................. 10-2021-0147103

(51) Int. Cl.
*B41J 11/42*    (2006.01)
*B41J 2/045*    (2006.01)
(Continued)

(52) U.S. Cl.
CPC ........... *B41J 11/42* (2013.01); *B41J 2/04505* (2013.01); *B41J 2/04526* (2013.01);
(Continued)

(58) Field of Classification Search
CPC . B41J 11/42; B41J 11/55; B41J 11/008; B41J 11/00; B41J 2/14; B41J 25/001;
(Continued)

(56) References Cited

U.S. PATENT DOCUMENTS

2023/0137402 A1*  5/2023  Lee .................. B41J 11/00
347/102

FOREIGN PATENT DOCUMENTS

JP    2006-210393    8/2006
JP    2010-232472    10/2010
(Continued)

OTHER PUBLICATIONS

Office Action dated Sep. 18, 2023 for Korean Patent Application No. 10-2021-0147103 and its English translation from Global Dossier.
(Continued)

*Primary Examiner* — Kristal Feggins
(74) *Attorney, Agent, or Firm* — Ladas & Parry, LLP

(57) ABSTRACT

The present disclosure provides a substrate treating apparatus having improved efficiency and productivity. The substrate treating apparatus provided includes a stage extending in a first direction, for moving a substrate in the first direction, and having an air floating system, a gantry arranged on the stage to extend in a second direction crossing the first direction, a head module installed on the gantry and movable in the second direction, and a displacement sensor installed in the head module, for measuring a separation distance between the substrate and stage, wherein at a first position, the head module ejects ink to the substrate and the displacement sensor measures a first separation distance between the substrate and the stage, and at a second position that is different from the first position, the head module ejects ink to the substrate and the displacement sensor measures a second separation distance between the substrate and the stage.

20 Claims, 13 Drawing Sheets

(51) Int. Cl.
    *B41J 11/00*         (2006.01)
    *B41J 11/55*         (2006.01)
    *B41J 25/00*         (2006.01)
    *H05K 3/12*          (2006.01)

(52) U.S. Cl.
    CPC ......... *B41J 2/04556* (2013.01); *B41J 11/008* (2013.01); *B41J 11/55* (2013.01); *B41J 25/001* (2013.01); *H05K 3/125* (2013.01)

(58) Field of Classification Search
    CPC .... B41J 29/00; B41J 2/04505; B41J 2/04526; B41J 2/04556; B41J 2/04503; B41J 2/2135; B41J 2/2139; B41J 19/145; B41J 25/304; B41J 25/3086; H05K 3/125; H01L 21/6715; H01L 21/67259; H01L 21/67784; H01L 21/68707
    See application file for complete search history.

(56) References Cited

FOREIGN PATENT DOCUMENTS

| | | |
|---|---|---|
| JP | 2014-183243 | 9/2014 |
| JP | 2015-022836 | 2/2015 |
| KR | 10-2019-0136927 | 12/2019 |
| KR | 10-2212256 | 2/2021 |

OTHER PUBLICATIONS

Office Action dated Oct. 3, 2023 for Japanese Patent Application No. 2022-169624 and its English translation from Global Dossier.

\* cited by examiner

110H : 110H_1, 110H_2

SUBSTRATE TREATING APPARATUS AND SUBSTRATE TREATING METHOD USING THE SAME

CROSS-REFERENCE TO RELATED APPLICATION

This application claims priority from Korean Patent Application No. 10-2021-0147103 filed on Oct. 29, 2021 in the Korean Intellectual Property Office, and all the benefits accruing therefrom under 35 U.S.C. 119, the contents of which in its entirety are herein incorporated by reference.

BACKGROUND

1. Technical Field

The present disclosure relates to a substrate processing or treating apparatus and a substrate processing or treating method using the same.

2. Description of the Related Art

In general, manufacturing an electronic circuit component or a flat panel display (FPD) such as a liquid crystal display panel involves the formation of certain patterns such as electrodes or dots on a glass surface or a printed circuit board (PCB) by using a photoresist (PR) liquid or a paste of metal such as copper (Cu), silver (Ag), and aluminum (Al).

Available methods of forming a certain pattern on a PCB or substrate include taking an offset printing method using two rolls to obtain a predetermined pattern through direct patterning and a method of discharging ink droplets. Here, for the discharging of ink droplets to the substrate, an inkjet printing system works similar to an ordinary inkjet printer and uses a method of utilizing a nozzle for obtaining a predetermined pattern on the substrate through direct patterning.

The inkjet printing system ejects ink droplets on the substrate while moving the substrate in a predetermined direction. To discharge ink droplets to a desired position in the substrate, the substrate needs to move by a constant amount of lift. When the substrate fails to secure a constant amount of lift, ink droplets could not be accurately ejected to the desired target position.

SUMMARY

Aspects of the present disclosure provide a substrate processing or treating apparatus having improved efficiency and productivity.

Another aspect of the present disclosure provides a substrate treating method with improved efficiency and productivity.

However, aspects of the present disclosure are not restricted to those set forth herein. The above and other aspects of the present disclosure will become more apparent to one of ordinary skill in the art to which the present disclosure pertains by referencing the detailed description of the present disclosure given below.

According to an aspect of the present disclosure, there is provided an apparatus for treating a substrate, including a stage, a gantry, a head module, and a displacement sensor. The stage extends in the first direction, is configured to move a substrate in the first direction, and has an air floating system. The gantry is arranged on the stage to extend in a second direction crossing the first direction. The head module is installed on the gantry and movable in the second direction. The displacement sensor is installed in the head module and configured to measure the separation distance between the substrate and the stage. Here, at a first position, the head module ejects ink to the substrate and the displacement sensor measures a first separation distance between the substrate and the stage, and at a second position that is different from the first position, the head module ejects ink to the substrate and the displacement sensor measures a second separation distance between the substrate and the stage.

In some embodiments, the substrate treating apparatus is configured to perform maintenance and/or repair of the stage when the first separation distance differs from the second separation distance by a difference that exceeds a preset value.

In some embodiments, the head module includes a nozzle unit configured to discharge the ink toward the substrate, and a distance in height direction between the stage and the nozzle unit is equal to a distance in height direction between the stage and the displacement sensor.

The substrate treating apparatus may further include a gripper installed on one side of the stage and configured to grip the substrate.

In some embodiments, the displacement sensor is configured to measure the flatness of the gripper.

In some embodiments, the first position and the second position are spaced apart from each other in the second direction.

The substrate treating apparatus may further include a control module capable of monitoring the first separation distance and the second separation distance in real time.

In some embodiments, the stage includes two first regions and a second region between the first regions, of which the second region of the stage is overlapped by the first position and the second position.

In some embodiments, the first regions each constitute an area configured to eject air toward the substrate, and the second region constitutes an area configured to eject air toward the substrate and suck air between the substrate and the stage.

According to another aspect of the present disclosure, there is provided an apparatus for treating a substrate, including a stage, a gripper, a gantry, a head module, and a displacement sensor. The stage extends in the first direction, is configured to move a substrate in the first direction, and has an air floating system. The gripper is installed on one side of the stage to grip the substrate. The gantry is arranged on the stage to extend in a second direction crossing the first direction. The head module is installed on the gantry and movable in the second direction. The displacement sensor is installed in the head module and configured to measure the separation distance between the substrate and the stage. Herein, at a first position, the head module ejects ink to the substrate and the displacement sensor measures a first separation distance between the substrate and the stage, at a second position that is different from the first position, the head module ejects ink to the substrate and the displacement sensor measures a second separation distance between the substrate and the stage, and at a third position that is different from the first position and the second position, the displacement sensor measures the flatness of the gripper.

In some embodiments, the first position and the second position are spaced apart from each other in the second direction.

The substrate treating apparatus may further include a control module capable of monitoring the first separation distance and the second separation distance in real time.

In some embodiments, the stage includes two first regions and a second region between the first regions, of which the second region of the stage is overlapped by the first position and the second position.

In some embodiments, the first regions each constitute an area configured to eject air toward the substrate, and the second region constitutes an area configured to eject air toward the substrate and suck air between the substrate and the stage.

In some embodiments, the head module includes a nozzle unit configured to discharge the ink toward the substrate, and a distance in height direction between the stage and the nozzle unit is equal to a distance in height direction between the stage and the displacement sensor.

According to yet another aspect of the present disclosure, there is provided a method of treating a substrate, including providing a stage extending in a first direction and moving a substrate in the first direction, providing a head module arranged on the stage to be movable in a second direction crossing the first direction, causing, at a first position, a displacement sensor that is installed in the head module to measure a first separation distance between the substrate and the stage, causing, at a second position different from the first position, the displacement sensor to measure a second separation distance between the substrate and the stage, and monitoring a difference between the first separation distance and the second separation distance.

The substrate treating method may further include performing maintenance and/or repair of the stage when the first separation distance differs from the second separation distance by a difference that exceeds a preset value.

The substrate treating method may further include causing, at a third position different from the first position and the second position, the displacement sensor to measure a third separation distance between the substrate and the stage.

The substrate treating method may further include monitoring differences between the first separation distance, the second separation distance, and the third separation distance.

In some embodiments, the head module includes a nozzle unit configured to discharge the ink toward the substrate, and a distance in height direction between the stage and the nozzle unit is equal to a distance in height direction between the stage and the displacement sensor.

BRIEF DESCRIPTION OF THE DRAWINGS

The above and other aspects and features of the present disclosure will become more apparent by describing in detail exemplary embodiments thereof with reference to the attached drawings, in which.

DETAILED DESCRIPTION OF THE EMBODIMENTS

Figure 1:
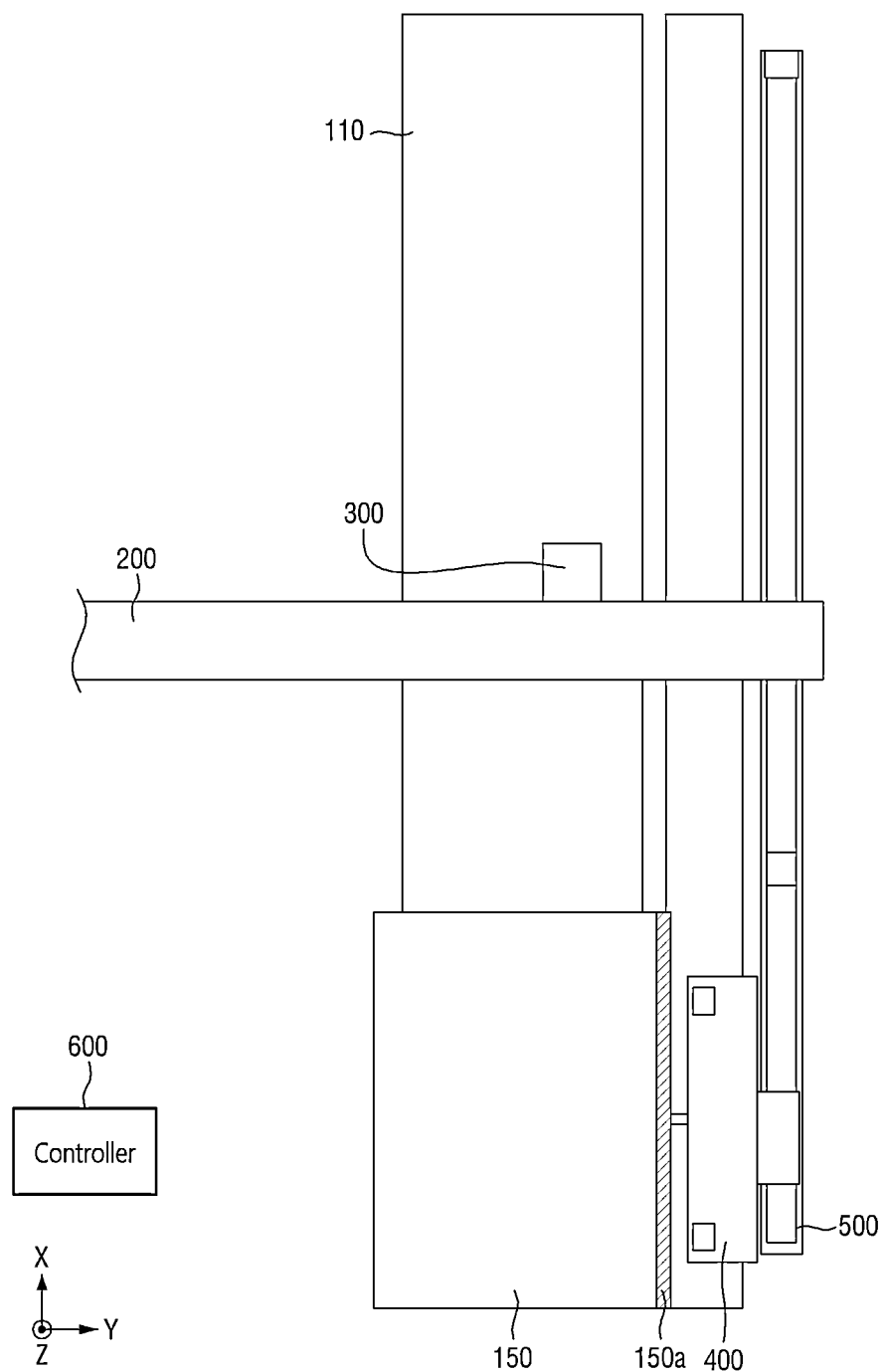
FIG. 1 is a schematic plan view of a substrate treating apparatus according to some embodiments of the present disclosure.

Advantages and features of the present disclosure and methods of accomplishing the same may be understood more readily by reference to the following detailed description of exemplary embodiments and the accompanying drawings. The present disclosure may, however, be embodied in many different forms and should not be construed as being limited to the embodiments set forth herein. Rather, these embodiments are provided so that this disclosure will be thorough and complete and will fully convey the concept of the disclosure to those skilled in the art, and the present disclosure will only be defined by the appended claims.

It will also be understood that when an element or a layer is referred to as being "on" another element or layer, it can be not only directly on the other element or layer, but also indirectly thereon with intervening elements or layers being present. In contrast, when an element is referred to as being "directly on" another element, there are no intervening elements present.

Spatially relative terms, such as "below," "beneath," "lower," "above," "upper," and the like, may be used herein for ease of description to convey one element's or feature's relationship to another element(s) or feature(s) as illustrated in the drawings. It will be understood that the spatially relative terms are intended to encompass different orientations of the device in use or operation in addition to the orientation depicted in the drawings. For example, when a device in the drawings is turned over, elements described as "below" or "beneath" other elements or features would then be oriented "above" the other elements or features. Thus, the illustrative term "below" can encompass both an orientation of above and below. The device may be otherwise oriented (rotated 90 degrees or at other orientations), and the spatially relative descriptors used herein may be interpreted accordingly.

It will be understood that, although the terms first, second, etc. may be used herein to describe various elements, components, and/or sections, these elements, components, and/or sections should not be limited by these terms. These terms are only used to distinguish one element, component, or section from another element, component, or section. Thus, a first element, first component, or first section discussed below could be termed a second element, second component, or second section without departing from the teachings of the present disclosure.

The terminology used herein is for the purpose of describing particular embodiments only and is not intended to be limiting of the present disclosure. As used herein, the singular forms "a," "an," and "the" are intended to include the plural forms as well, unless the context clearly indicates otherwise. It will be further understood that the terms "comprises," "comprising," "includes," and/or "including," when used herein, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, some embodiments of the present disclosure will be described in detail with reference to the accompanying drawings. In the following description, like reference numerals designate like elements, although the elements are shown in different drawings. Further, in the following description of some embodiments, a detailed description of related known components and functions when considered to obscure the subject of the present disclosure will be omitted for the purpose of clarity and for brevity.

Hereinafter, a substrate treating apparatus according to some embodiments will be described with reference to FIGS. 1 to 6. The substrate treating apparatus according to some embodiments may be an inkjet printing system.

Figure 2:
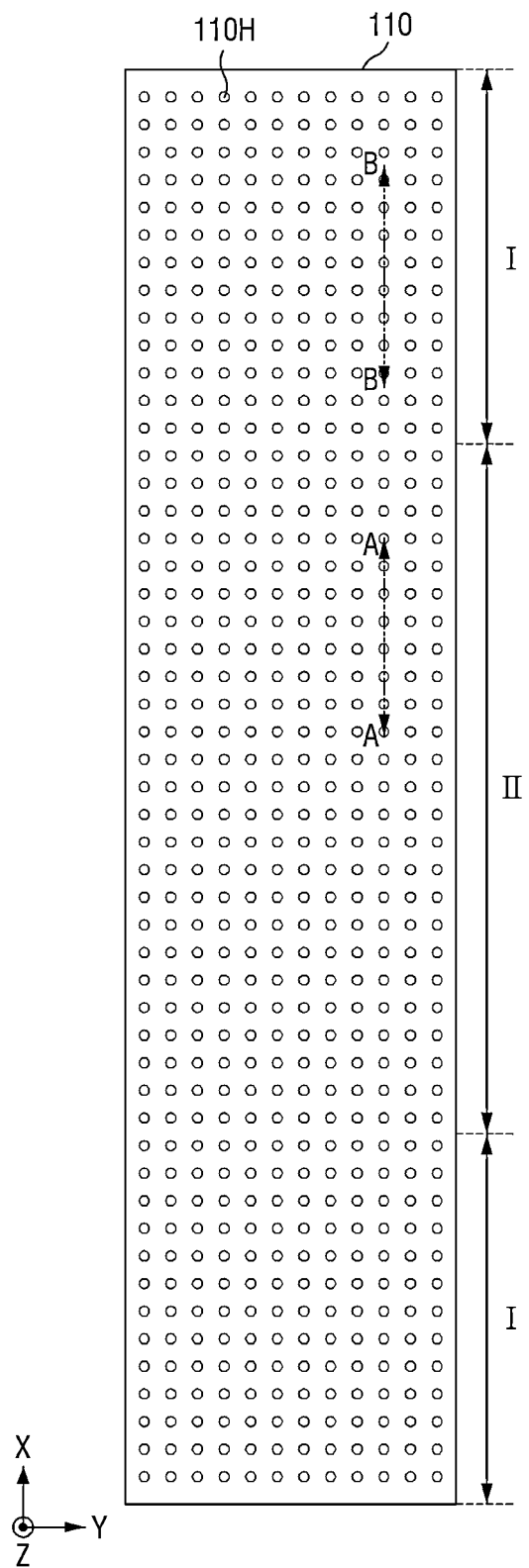
FIG. 2 is a diagram for illustrating a stage of FIG. 1.
Figure 3:
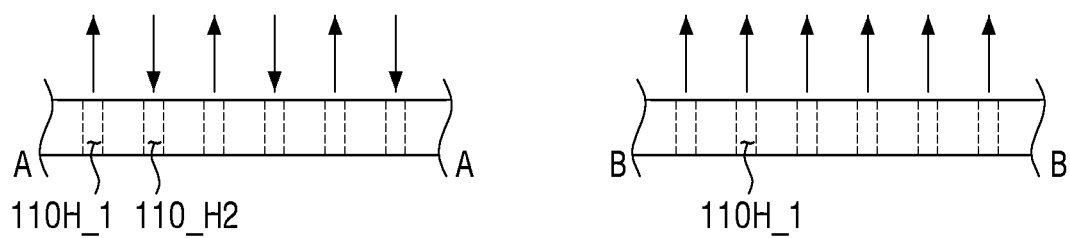
FIG. 3 is a cross-sectional view taken along line A-A and line B-B of FIG. 2.

FIG. 1 is a schematic plan view of a substrate treating apparatus according to some embodiments of the present disclosure. FIG. 2 is a diagram for illustrating a stage 110 of FIG. 1. FIG. 3 is a cross-sectional view taken along line A-A and line B-B of FIG. 2.

Referring first to FIG. 1, a substrate treating apparatus according to some embodiments may include a stage 110, a gantry 200, a head module 300, a gripper 400, a transfer rail 500, and a controller or control module 600.

The stage 110 is an area for supporting and moving the substrate 150. A method of moving the substrate 150 on the stage 110 is not limited to a specific one. The present specification illustrates a substrate treating apparatus in which the gripper 400 holds and moves the substrate 150, but the present disclosure is not limited thereto. For example, the substrate 150 may be moved by a plate moving in a roll-to-roll manner.

The stage 110 may extend in a first direction X. For example, the stage 110 may include a short side extending in a second direction Y and a long side extending in the first direction X. In this specification, the first direction X and the second direction Y may be directions crossing each other. A third direction Z may be crossing the first direction X and the second direction Y. For example, the first direction X, the second direction Y, and the third direction Z may be substantially perpendicular to each other.

On the stage 110, the substrate 150 may be moved along the first direction X. Here, the substrate 150 may be a transparent substrate (e.g., a glass substrate) used in a display device. For example, the substrate 150 may be a glass substrate for mass production.

Referring to FIGS. 2 and 3, the stage 110 may include two first regions I and a second region II. The second region II may be interposed between the first regions I. In particular, the first regions I may each be disposed in an edge region of the stage 110, and the second region II may be disposed in a central region of the stage 110.

For example, the stage 110 may include an air floating system. More particularly, the stage 110 may be an air floating system including the first regions I and the second region II. The first regions I and the second region II of the stage 110 may be continuous. However, the technical idea of the present disclosure is not limited thereto. Additionally, in the present specification, the second region II is illustrated as being interposed between the first regions I, but the present disclosure is not limited thereto. In some embodiments, one first region I may be disposed on one side of the stage 110 and one region II may be disposed on the other side thereof.

The first regions I of the stage 110 may be regions adapted to eject air in the third direction Z. The first regions I of the stage 110 may be regions for holding from sucking air on the first regions I. The first regions I may be regions adapted to load or unload the substrate 150 on or from the stage 110. The first regions I may be regions where no printing process is performed. The printing process may be a process of discharging ink to the substrate 150. For example, the first regions I may be regions where the head module 300 does not discharge ink toward the substrate 150.

The second region II of the stage 110 may be a region adapted to eject air in the third direction Z while sucking air on the second region II. For example, the second region II of the stage 110 may be a region that sucks air between the substrate 150 and the stage 110 while ejecting air toward the substrate 150. Additionally, the second region II may be a region in which a printing process is performed. The second region II may be a region in which the head module 300 discharges ink toward the substrate 150.

In some embodiments, the stage 110 may include a plurality of holes 110H. The hole 110H may be a hole for ejecting air or a hole for sucking air. For example, the first regions I of the stage 110 may have just the holes for ejecting air. The second region II of the stage 110 may have an alternate arrangement of holes for ejecting air and holes for sucking air.

In FIG. 3, the hole 110H of the stage 110 may include first holes 110H_1 and second holes 110H_2. The first holes 110H_1 may be holes for ejecting air. The second holes 110H_2 may be the holes for sucking air.

The second region II of the stage 110 may include the first holes 110H_1 for ejecting air upward and the second holes 110H_2 for sucking air. Although the first holes 110H_1 and the second holes 110H_2 are illustrated as being alternately arranged, the present disclosure is not limited thereto. The first regions I of the stage 110 may include only the first holes 110H_1 for ejecting air upward.

Referring back to FIG. 1, the transport rail 500 may be disposed on one side of the stage 110. The transfer rail 500 may extend lengthwise in the first direction X. The transfer rail 500 allows moving the substrate 150 in the first direction X. For example, the gripper 400 may grip one side of the substrate 150 and move along the transfer rail 500. With the gripper 400 holding the substrate 150 and moving in the first direction X along the transfer rail 500, the substrate 150 moves in the first direction X along the transfer rail 500.

The gripper 400 may be disposed on one side of the substrate 150 to grip the substrate 150. The gripper 400 may be coupled to the transfer rail 500 to move in the first direction X. The gripper 400 may grip and transfer the substrate 150. The gripper 400 may hold the substrate 150 by suction. The substrate 150 may include a grip portion 150a that is adhered by suction to the gripper 400. The grip portion 150a may be on one side of the substrate 150. For example, when the substrate 150 includes long sides extending in the first direction X and short sides extending in the second direction Y, the grip portion 150a may be one of the long sides of the substrate 150. Then, the gripper 400 may hold by suction one of the long sides of the substrate 150.

The gantry 200 may be disposed on the stage 110 to cross thereof. The gantry 200 may extend lengthwise in the second direction Y, for example. The gantry 200 may be disposed on the second region II of the stage 110.

The head module 300 may be installed on the gantry 200 and move along the gantry 200. The head module 300 may move in the second direction Y, but is not limited thereto.

In some embodiments, although not shown, when the head module 300 is in its movement in the second direction Y, a distance in the third direction Z or height direction between the substrate 150 and the head module 300 may become smaller. In other words, when in its standby state, the head module 300 may be distanced from the substrate 150 by a greater distance in the third direction Z or height direction than the distance in height direction between the substrate 150 and the head module 300 when in its movement. When the head module 300 is in its movement, as the substrate 150 and the head module 300 come closer together, a nozzle unit 320 in FIG. 4 of the head module 300 may eject ink accurately toward the substrate 150.

The control module 600 may monitor the separation distance between the substrate 150 and the stage 110 in real time. The control module 600 may monitor the flatness of the gripper 400 in real time. The control module 600 may monitor the separation distance and the flatness to determine whether to perform maintenance and/or repair of the stage 110 and the gripper 400.

Figure 4:
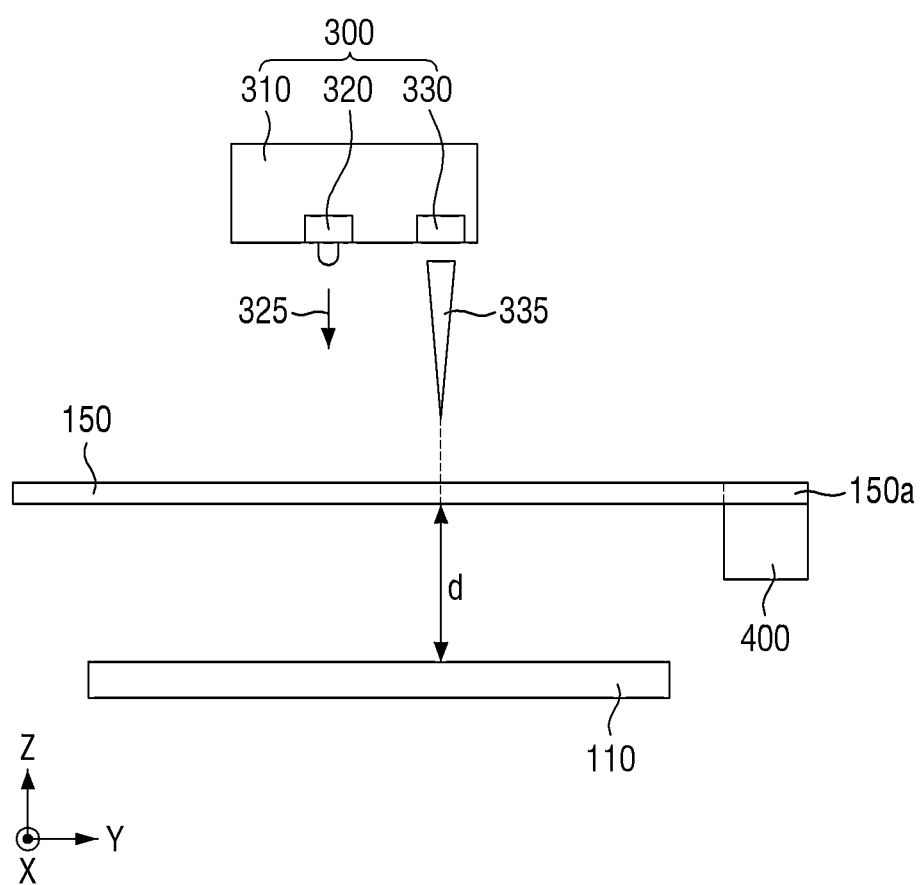
FIGS. 4 and 5 are cross-sectional views of an example substrate treating apparatus taken along a second direction, according to some embodiments.
Figure 5:
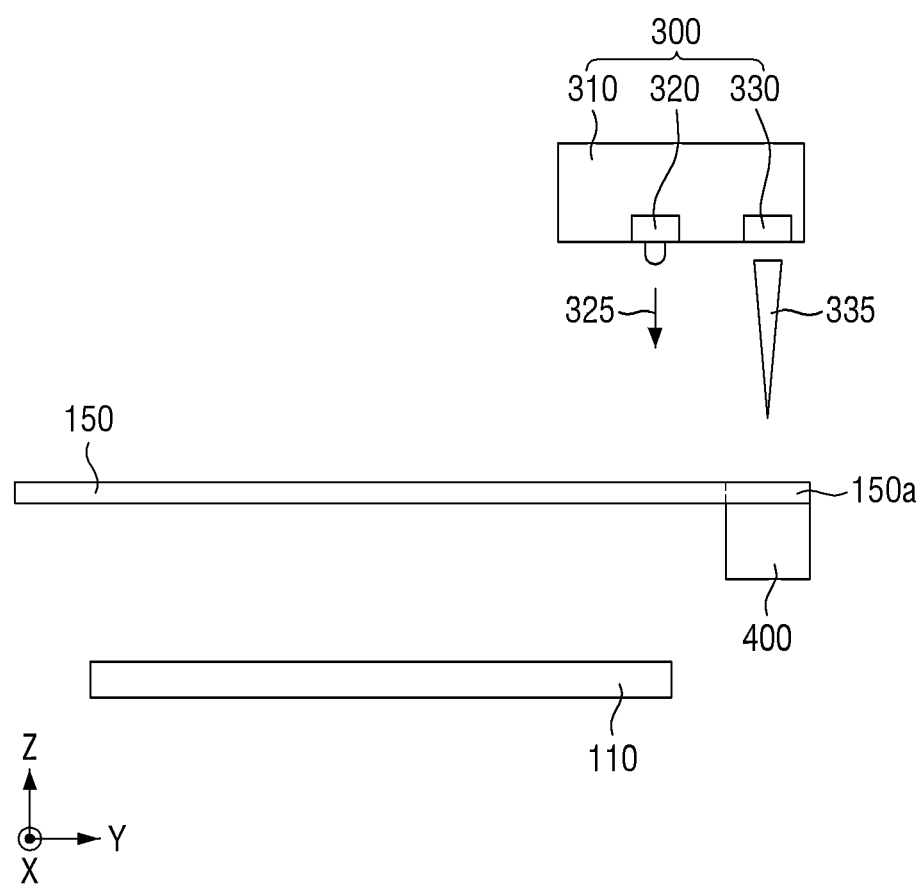
Figure 6:
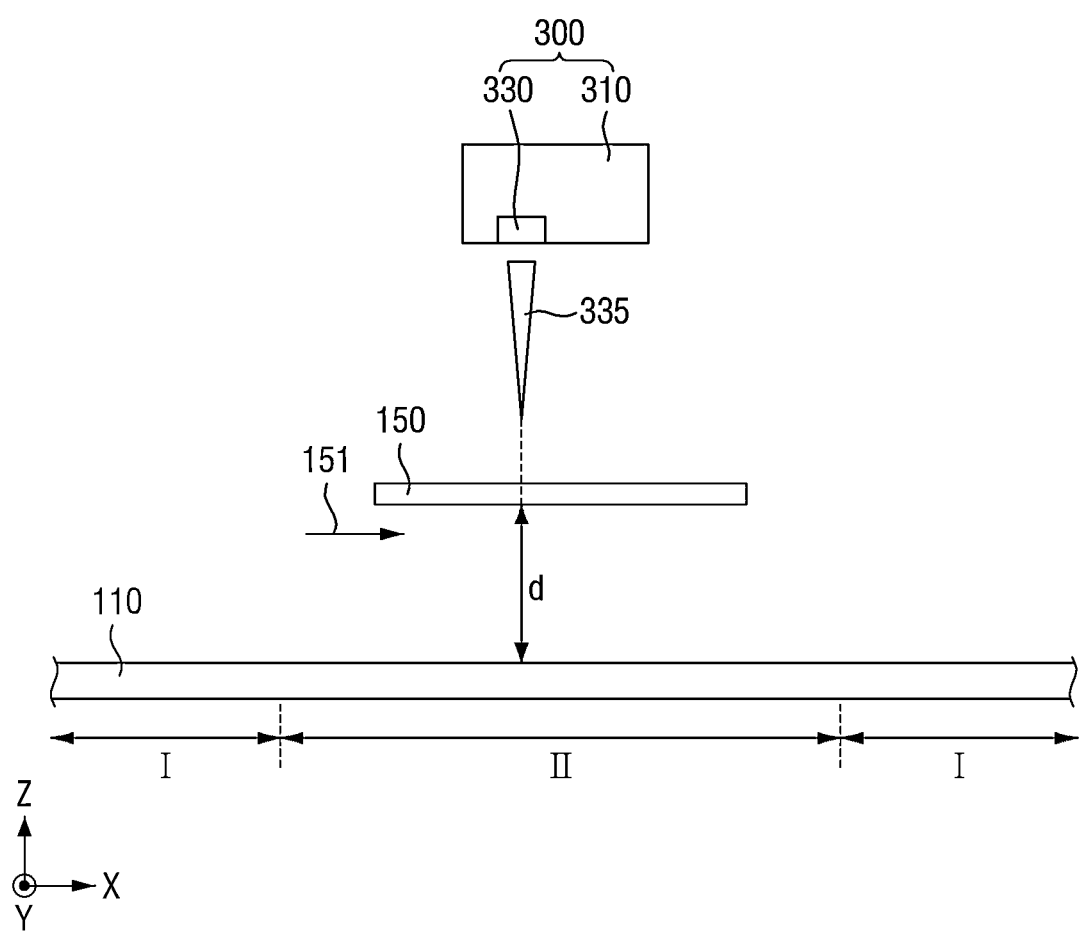
FIG. 6 is a cross-sectional view of an example substrate treating apparatus taken along a first direction, according to some embodiments.

FIGS. 4 and 5 are cross-sectional views of an example substrate treating apparatus taken along the second direction, according to some embodiments. FIG. 6 is a cross-sectional view of an example substrate treating apparatus taken along the first direction, according to some embodiments.

The following describes a substrate treating apparatus and an exemplary operation method of the substrate treating apparatus according to some embodiments in more detail with reference to FIGS. 4 to 6.

Referring to FIGS. 4 to 6, the head module 300 may include a body 310, a nozzle unit 320, and a displacement sensor 330. The body 310 may be a part linked to the gantry 200. The body 310 may be fixed to the gantry 200. The body 310 may fix the nozzle unit 320 and the displacement sensor 330. The nozzle unit 320 may be a part that discharges ink toward the substrate 150. The displacement sensor 330 may be a sensor that measures the amount of floating of the substrate 150.

In some embodiments, the nozzle unit 320 may include multiple nozzles. The ink discharged by the head module 300 may be, for example, Quantum Dot (QD) ink, but is not limited thereto. The multiple nozzles of the nozzle unit 320 may eject a plurality of ink droplets to the substrate 150 as indicated by an arrow 325.

In some embodiments, the displacement sensor 330 may measure the amount of floating of the substrate 150 as indicated by an icon 335. The floating amount of the substrate 150 may represent a separation distance d of the substrate 150 from the stage 110 in the third direction Z. The displacement sensor 330 may measure and transmit the amount of floating of the substrate 150 to the control module 600. The control module 600 may monitor the amount of floating of the substrate 150 in real time. The control module 600 may monitor the amount of floating of the substrate 150 to determine whether to perform maintenance and/or repair of the substrate treating apparatus according to some embodiments.

For example, the present disclosure in some embodiments measures, in a first position, the floating amount of the substrate 150, measures, in a second position, the floating amount of the substrate 150, and monitors a difference between the two floating amounts. When the difference between the two floating amounts exceeds a preset value, the substrate treating apparatus may maintain and/or repair the stage 110.

More specifically, the stage 110 having an air floating system may include a precision floating area. For example, a region where the head module 300 discharges ink toward the substrate 150 may be a precision floating region (e.g., the second region of FIG. 2). In the precision floating area, the amount of floating of the substrate 150 needs to be constant for allowing ink to be accurately discharged. The displacement sensor 330 may measure the amount of floating of the board 150 in real time and transmit the measured floating amount to the control module 600 which may then monitor the floating amount in real time. When the result of real-time monitoring exhibits an inconsistent floating amount of the substrate 150, the substrate treating apparatus may perform the maintenance and/or repair work.

In some embodiments, ejecting ink to the substrate 150 by the nozzle unit 320 and measuring the floating amount of the substrate 150 by the displacement sensor 330 may be simultaneously performed. Additionally, the distance in the third direction Z from the substrate 150 to the displacement sensor 330 may be equal to the distance in the third direction Z from the substrate 150 to the head module 300 or the substrate 150 or equal to the distance in the third direction Z from the substrate 150 to the nozzle unit 320. Accordingly, the conditions for discharging ink to the substrate 150 may be the same as the conditions for measuring the floating amount of the substrate 150.

In some embodiments, the displacement sensor 330 may measure the flatness of the gripper 400. Measuring the flatness of the gripper 400 may mean measuring the flatness of the substrate 150 held by the gripper 400, but is not limited thereto.

In FIG. 4, when the displacement sensor 330 is positioned to overlap the substrate 150 in the third direction Z, the displacement sensor 330 may measure the separation distance d between the substrate 150 and the stage 110.

In FIG. 5, when the displacement sensor 330 is positioned to overlap the grip portion 150a of the substrate 150 in the third direction Z, the displacement sensor 330 may measure the flatness of the gripper 400.

In FIG. 6, while the displacement sensor 330 measures the separation distance d between the substrate 150 and the stage 110, the substrate 150 may be moved in the first direction X as indicated by the arrow 151. In this way, as the substrate 150 moves in the first direction X, the separation distance d between the substrate 150 and the stage 110 may be continuously measured along the first direction X.

The following describes a substrate treating method according to some embodiments with reference to FIGS. 7 to 13.

Figure 7:
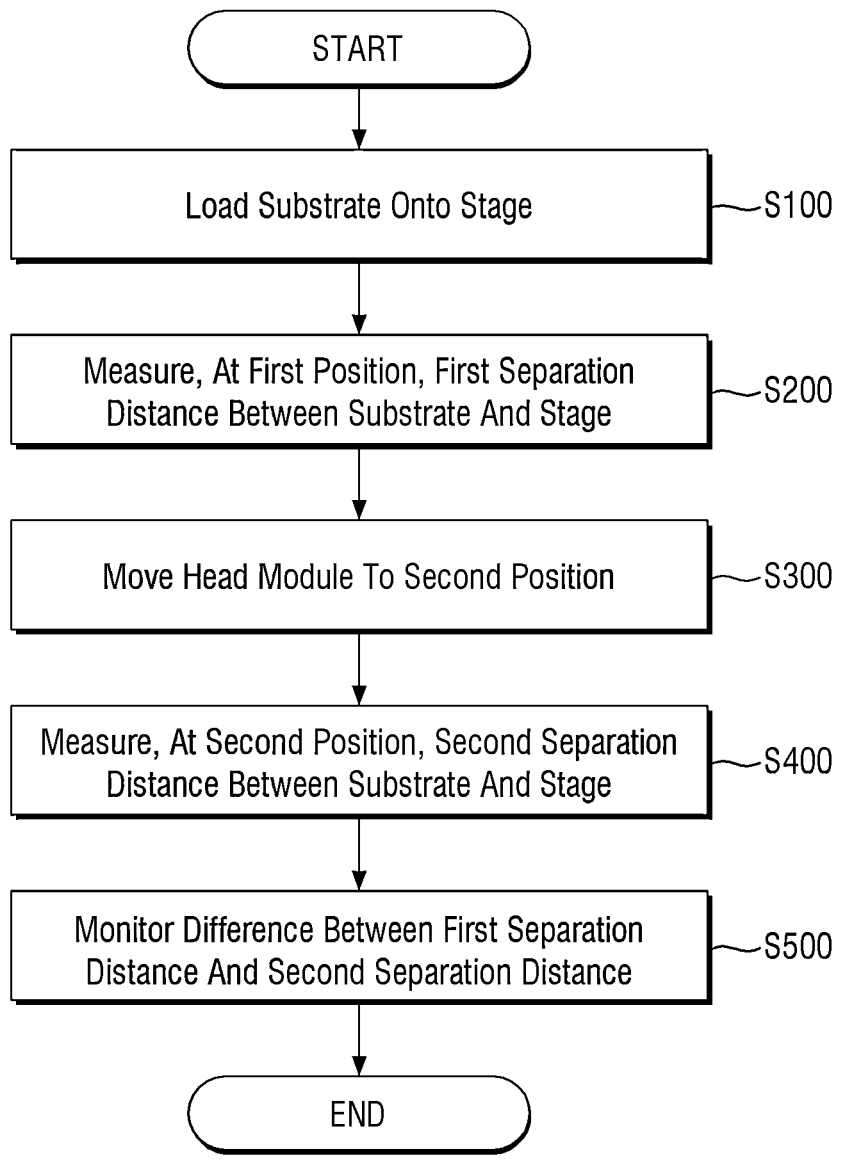
FIG. 7 is a flowchart for describing an example substrate treating method according to some embodiments.

FIG. 7 is a flowchart for describing an example substrate treating method according to some embodiments. FIGS. 8 to 13 are diagrams for explaining a method of operating a substrate treating apparatus according to some embodiments.

Referring to FIG. 7, the substrate treating method according to some embodiments may include loading a substrate onto the stage (S100), measuring, in a first position, a first separation distance between the substrate and the stage (S200), moving the head module to a second position (S300), measuring, in a first second, a second separation distance between the substrate and the stage (S400), and monitoring the difference the first separation distance and the second separation distance (S500).

Figure 8:
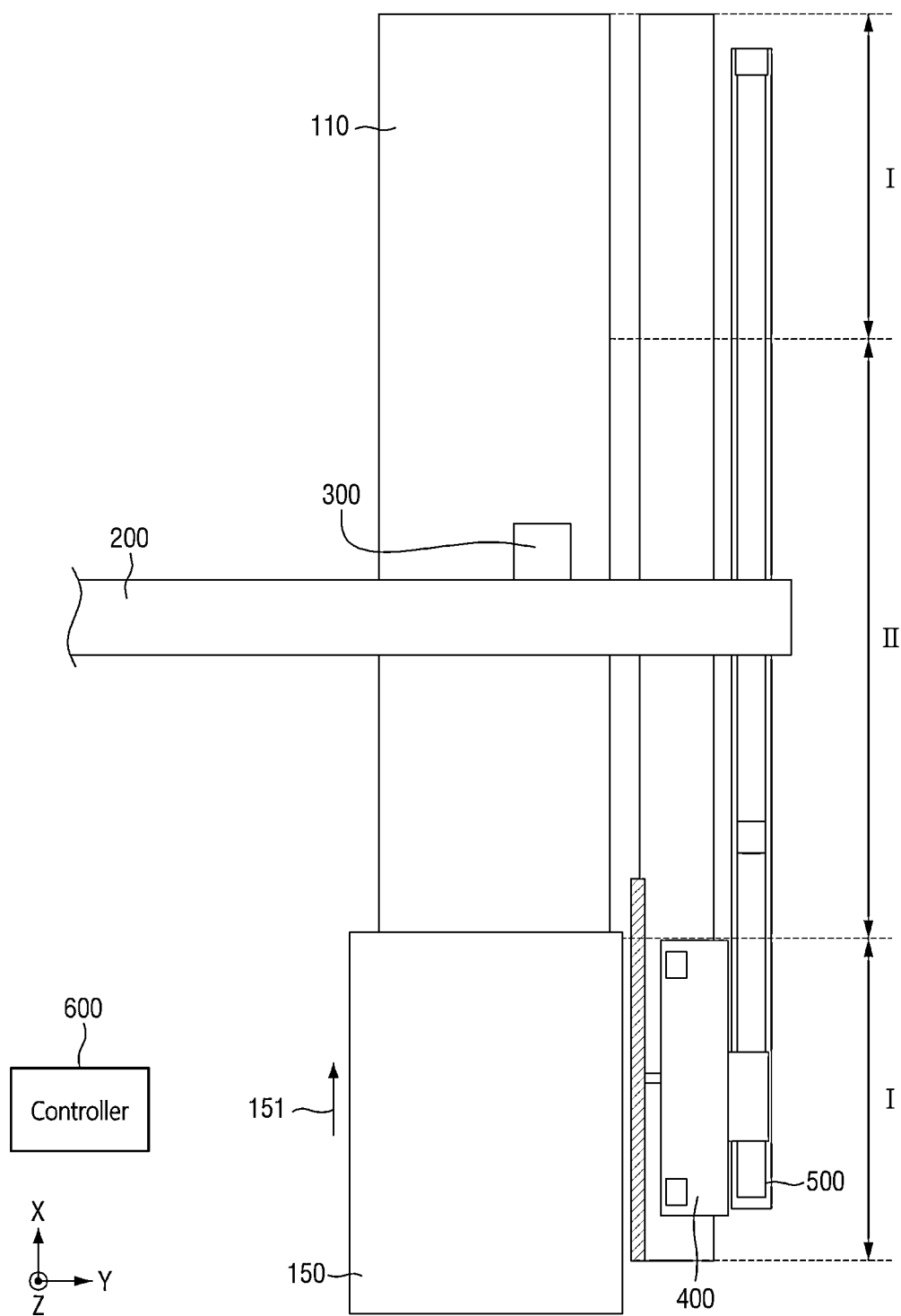
FIGS. 8 to 13 are diagrams for explaining a method of operating a substrate treating apparatus according to some embodiments.

Referring to FIGS. 7 and 8, the substrate 150 may be loaded onto the stage 110 (S100).

The substrate 150 may be loaded onto one of the first regions I of the stage 110. The substrate 150 may be loaded while moving in the first direction X as indicated by arrow 151. The gripper 400 does not grip the substrate 150 until the same is completely loaded. When the substrate 150 is completely loaded, the gripper 400 may grip and align the substrate 150. Although not shown, the substrate 150 may include alignment marks. The substrate treating apparatus may align the substrate 150 by using the alignment marks. Aligning the substrate 150 may include aligning the substrate 150 in parallel with a plane extending in the first direction X and the second direction Y, and aligning the substrate 150 to have its long side extend in parallel with the first direction X.

Figure 9:
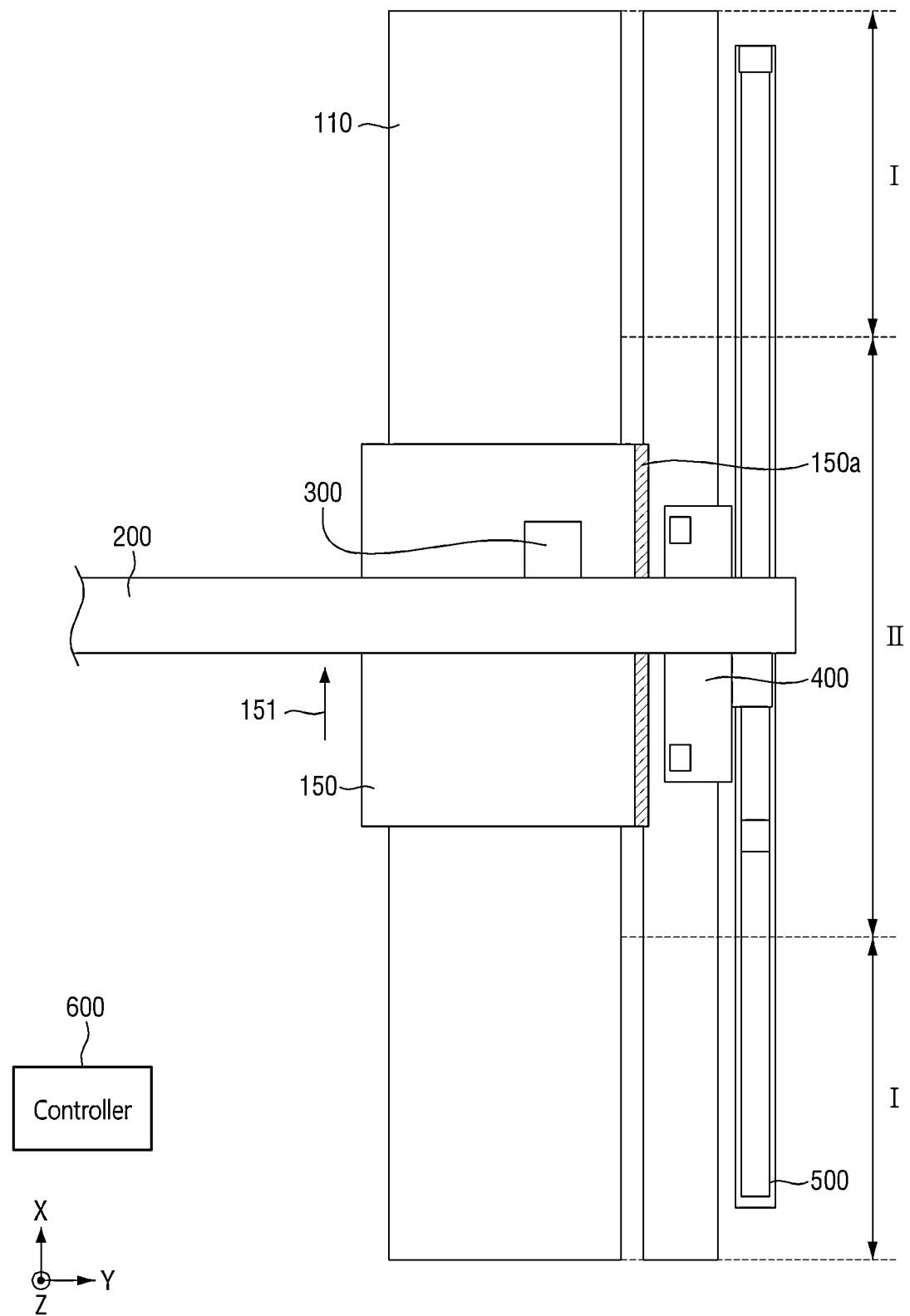

Referring to FIG. 9, the substrate 150 may be moved from the first region I to the second region II as indicated by arrow 151.

The substrate 150 moves in the first direction X into the second region II. Specifically, the gripper 400 grips the grip portion 150a of the substrate 150. Thereafter, the gripper 400 moves in the first direction X along the transfer rail 500. With the gripper 400 holding the substrate 150, when the gripper 400 moves, the substrate 150 can come along.

Figure 10:
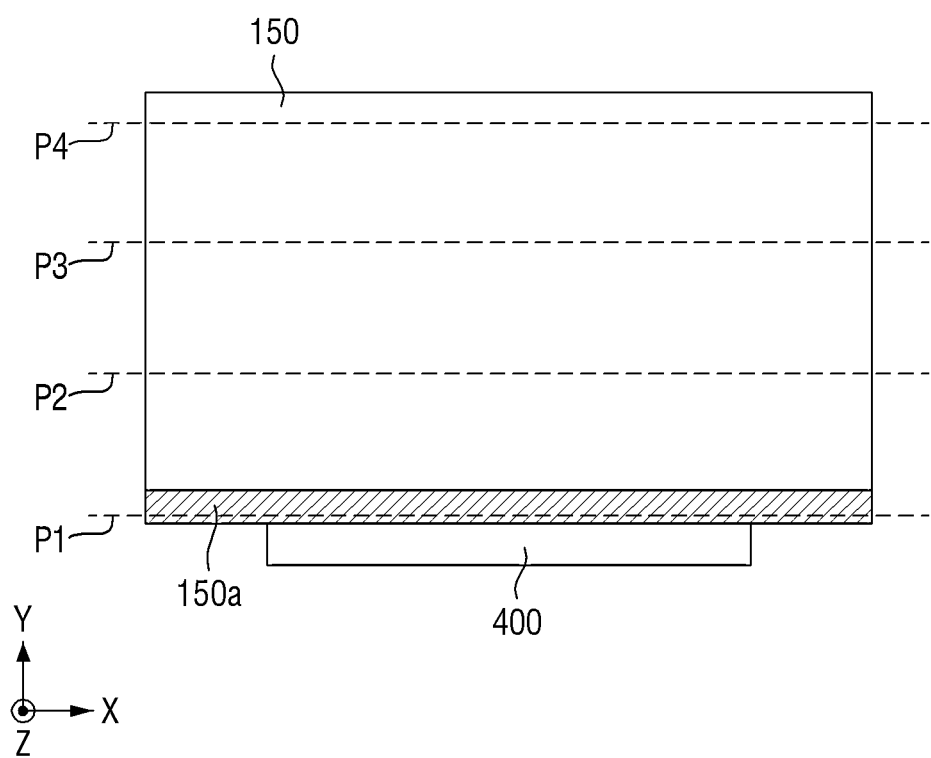

FIG. 10 is a plan view of a substrate in accordance with some embodiments.

Referring to FIG. 10, the substrate 150 may include first to fourth positions P1, P2, P3, and P4. The second, third, and fourth positions P2, P3, P4 in the substrate 150 may represent positions occupied by the displacement sensor 330 (in FIG. 4) when moving in the second direction Y to measure the amount of floating of the substrate 150. The first position P1 may represent a position occupied by the displacement sensor 330 when moving in the second direction Y to measure the flatness of the gripper 400. Hereinafter, a method of operating a substrate treating apparatus according to some embodiments will be described in more detail.

Figure 11:
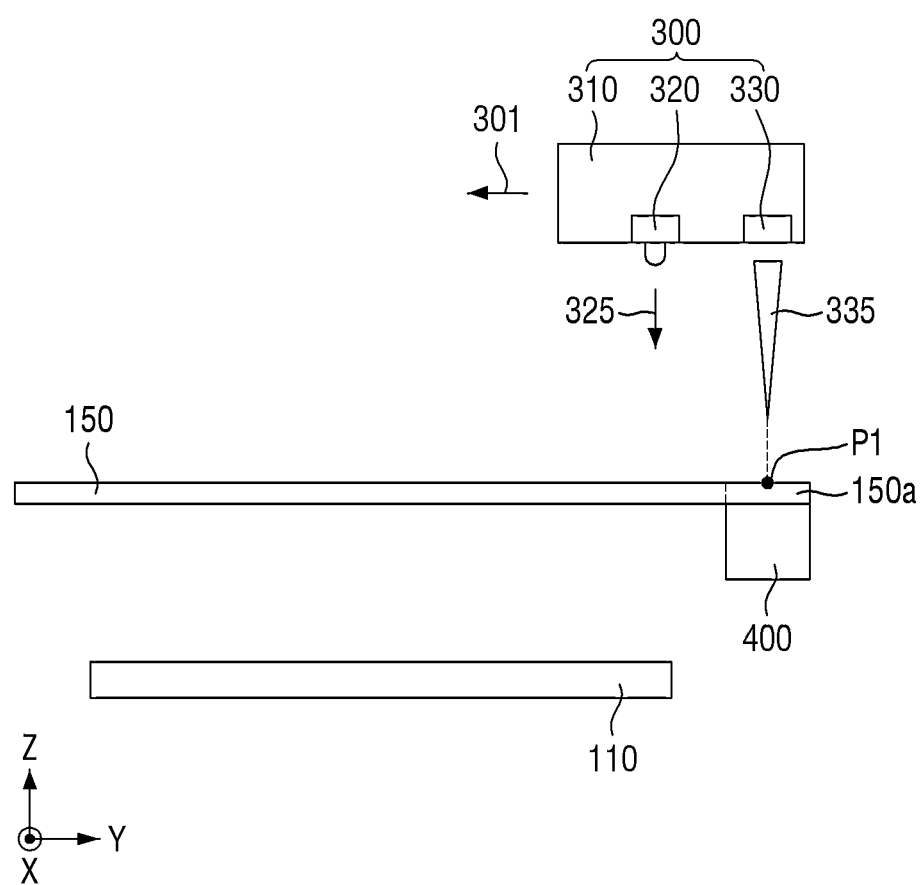

Referring to FIGS. 10 and 11, the head module 300 may move to the first position P1.

The head module 300 moving to the first position P1 may mean the movement of the displacement sensor 330 of the head module 300 to a position where the displacement sensor 330 overlaps the first position P1 in the third direction Z. The first position P1 may overlap the grip portion 150a of the substrate 150 in the first direction X. The first position P1 may extend in the first direction X on the grip portion 150a of the substrate 150.

Then, the displacement sensor 330 measures the flatness of the gripper 400 as indicated by the icon 335. While the substrate 150 moves in the first direction X, the displacement sensor 330 may continuously measure the flatness of the gripper 400.

While the displacement sensor 330 measures the flatness of the gripper 400, the nozzle unit 320 may eject ink to the substrate 150 as indicated by arrow 325. This means that ejecting ink to the substrate 150 by the nozzle unit 320 and measuring the flatness of the gripper 400 by the displacement sensor 330 may proceed simultaneously.

Figure 12:
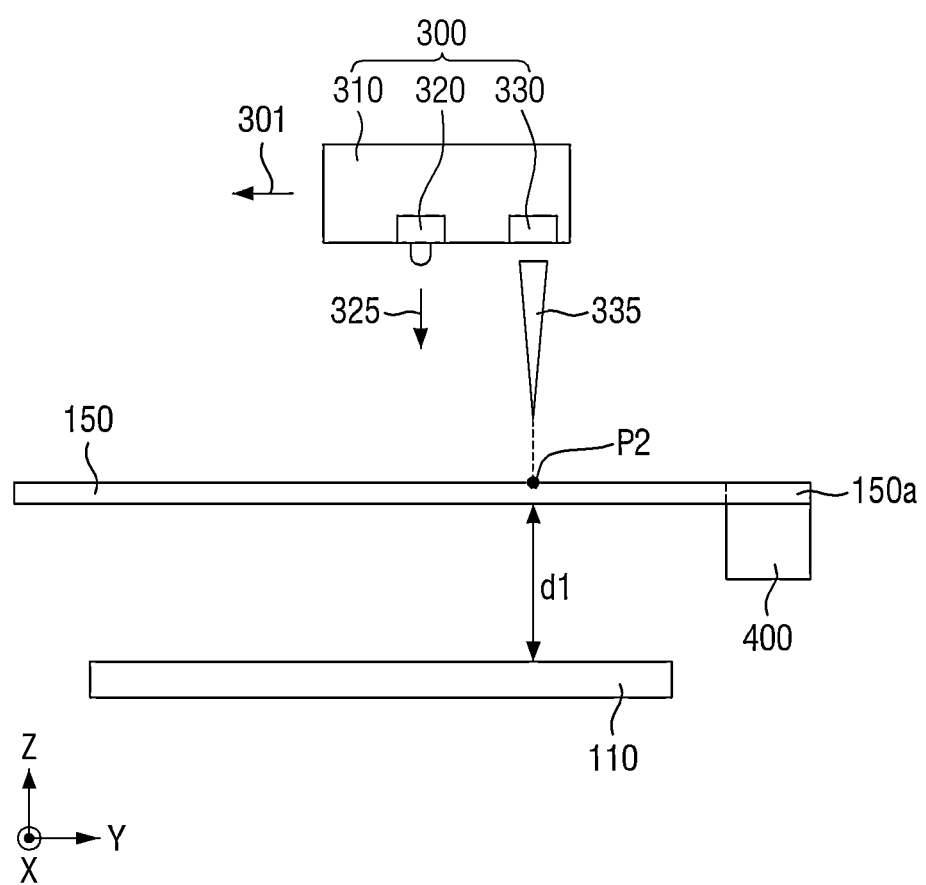

Referring to FIGS. 10 and 12, the head module 300 may move to the second position P2 as indicated by the arrow 301. The second position P2 may be overlapped by the displacement sensor 330 of the head module 300 in the third direction Z. The second position P2 may extend in the first direction X on the substrate 150.

The displacement sensor 330 may measure, in the second position P2, a first separation distance d1 between the substrate 150 and the stage 110 (Step S200 in FIG. 7). The first separation distance d1 may mean a separation distance measured in the third direction Z between the substrate 150 and the stage 110. The first separation distance d1 may be a floating amount of the substrate 150 at the second position P2.

In the second position P2, while the displacement sensor 330 measures the flatness of the gripper 400 as indicated by the icon 335, the nozzle unit 320 may eject ink to the substrate 150 as indicated by arrow 335. In other words, the ejecting of ink to the substrate 150 by the nozzle unit 320 and the measuring of the amount of floating of the substrate 150 by the displacement sensor 330 may proceed concurrently.

Figure 13:
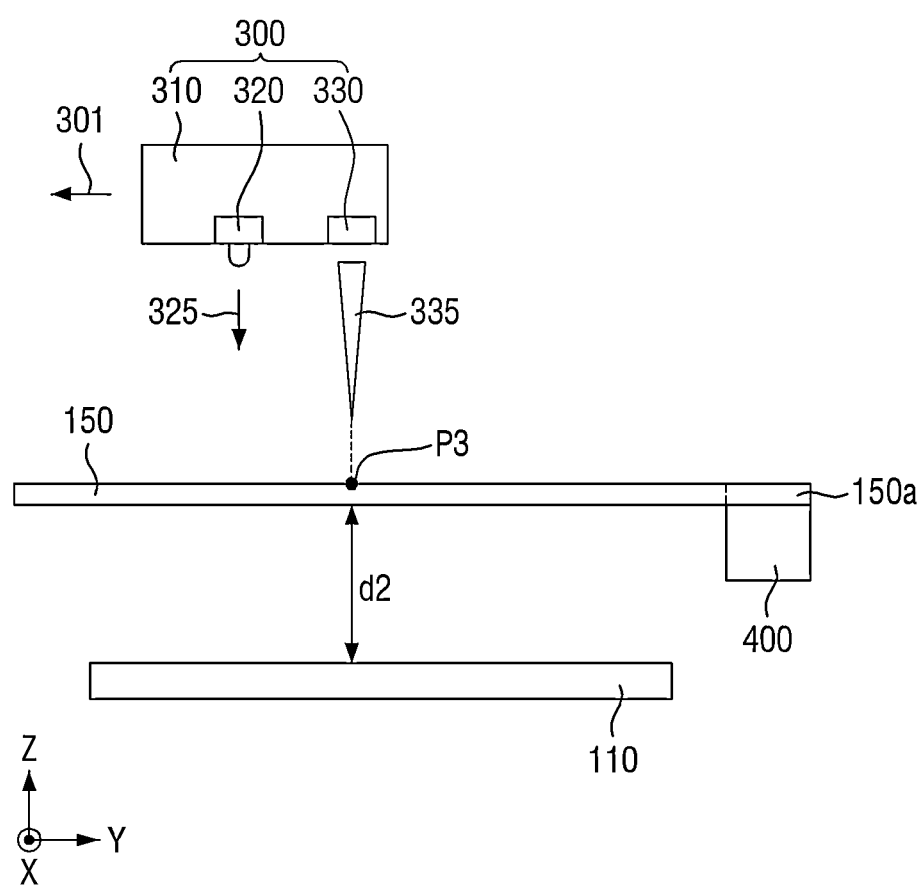

Referring to FIGS. 10 and 13, the head module 300 may move to the third position P3 (Step S300 in FIG. 7).

In particular, the head module 300 may move in the second direction Y from the second position P2 to the third position P3 as indicated by the arrow 301. The third position P3 may be overlapped by the displacement sensor 330 of the head module 300 in the third direction Z. The third position P3 may extend in the first direction X on the substrate 150.

The displacement sensor 330 may measure a second separation distance d2 between the substrate 150 and the stage 110 at the third position P3 (S400 of FIG. 7). The second separation distance d2 may mean a separation distance measured in the third direction Z between the substrate 150 and the stage 110. The second separation distance d2 may be a floating amount of the substrate 150 at the third position P3.

In the third position P3, while the displacement sensor 330 measures the flatness of the gripper 400 as indicated by the icon 335, the nozzle unit 320 may eject ink to the substrate 150 as indicated by the arrow 325. In other words, the ejecting of ink to the substrate 150 by the nozzle unit 320 and the measuring of the amount of floating of the substrate 150 by the displacement sensor 330 may proceed concurrently.

Although not shown, the head module 300 may move to the fourth position P4. The head module 300 may move in the second direction Y as indicated by the arrow 301. At the fourth position P4 in the substrate 150, the displacement sensor 330 may measure a third separation distance between the substrate 150 and the stage 110. Although the present specification describes measuring the separation distances between the substrate 150 and the stage 110 at the second, third, and fourth positions P2, P3, P4, the technical idea of the present disclosure is not limited thereto.

Subsequently, the control module 600 (FIG. 1) may monitor the difference between the first separation distance d1 and the second separation distance d2 (S500 in FIG. 7). When the difference between the first separation distance d1 and the second separation distance d2 is close to 0, the substrate treating apparatus may determine that the floating amount of the substrate 150 is constant. However, at the occurrence of a difference between the first separation distance d1 and the second separation distance d2, the substrate treating apparatus may determine that the floating amount of the substrate 150 is inconstant. When the floating amount of the substrate 150 is inconstant, the efficiency and accuracy of the printing process may be reduced. In this case, the substrate treating apparatus needs to be maintained and/or repaired.

The substrate treating apparatus according to some embodiments may maintain and/or repair the stage 110 responsive to when the difference between the first separation distance d1 and the second separation distance d2 exceeds a preset value. The present disclosure in some embodiments can provide a substrate treating apparatus with improved efficiency and reliability by monitoring the amount of floating of the substrate 150 in real time, and a substrate treating method using the same.

In some embodiments, when the displacement sensor 330 measures at 'n' positions, 'n' separation distances, the control module 600 may monitor the differences between two respective ones of the 'n' separation distances. The more the measured separation distances, the more accurate result can be obtained when determining whether the floating amount of the substrate 150 is constant.

While a few exemplary embodiments of the present disclosure have been described with reference to the accompanying drawings, those skilled in the art will readily appreciate that various changes in form and details may be made therein without departing from the technical idea and scope of the present disclosure as defined by the following claims. Therefore, it is to be understood that the foregoing is illustrative of the present disclosure in all respects and is not to be construed as limited to the specific exemplary embodiments disclosed.

The invention claimed is:

1. An apparatus for treating a substrate, comprising:
a stage extending in a first direction, configured to move a substrate in the first direction, and having an air floating system;
a gantry arranged on the stage to extend in a second direction crossing the first direction;
a head module installed on the gantry and movable in the second direction; and
a displacement sensor installed in the head module and configured to measure a separation distance between the substrate and the stage,
wherein at a first position, the head module ejects ink to the substrate and the displacement sensor measures a first separation distance between the substrate and the stage, and
at a second position that is different from the first position, the head module ejects ink to the substrate and the displacement sensor measures a second separation distance between the substrate and the stage.

2. The apparatus of claim 1, configured to perform maintenance and/or repair of the stage when the first separation distance differs from the second separation distance by a difference that exceeds a preset value.

3. The apparatus of claim 1, wherein the head module includes a nozzle unit configured to discharge the ink toward the substrate, and
wherein a distance in height direction between the stage and the nozzle unit is equal to a distance in height direction between the stage and the displacement sensor.

4. The apparatus of claim 1, further comprising:
a gripper installed on one side of the stage and configured to grip the substrate.

5. The apparatus of claim 4, wherein the displacement sensor is configured to measure a flatness of the gripper.

6. The apparatus of claim 1, wherein the first position and the second position are spaced apart from each other in the second direction.

7. The apparatus of claim 1, further comprising:
a control module capable of monitoring the first separation distance and the second separation distance in real time.

8. The apparatus of claim 1, wherein the stage includes two first regions and a second region between the first regions, of which the second region of the stage is overlapped by the first position and the second position.

9. The apparatus of claim 8, wherein the first regions each comprise an area configured to eject air toward the substrate, and
wherein the second region comprises an area configured to eject air toward the substrate and suck air between the substrate and the stage.

10. An apparatus for treating a substrate, comprising:
a stage extending in a first direction, configured to move a substrate in the first direction, and having an air floating system;
a gripper installed on one side of the stage to grip the substrate;
a gantry arranged on the stage to extend in a second direction crossing the first direction;
a head module installed on the gantry and movable in the second direction; and
a displacement sensor installed in the head module and configured to measure a separation distance between the substrate and the stage,
wherein at a first position, the head module ejects ink to the substrate and the displacement sensor measures a first separation distance between the substrate and the stage,
at a second position that is different from the first position, the head module ejects ink to the substrate and the displacement sensor measures a second separation distance between the substrate and the stage, and
at a third position that is different from the first position and the second position, the displacement sensor measures a flatness of the gripper.

11. The apparatus of claim 10, wherein the first position and the second position are spaced apart from each other in the second direction.

12. The apparatus of claim 10, further comprising:
a control module capable of monitoring the first separation distance and the second separation distance in real time.

13. The apparatus of claim 10, wherein the stage includes two first regions and a second region between the first regions, of which the second region of the stage is overlapped by the first position and the second position.

14. The apparatus of claim 13, wherein the first regions each comprise an area configured to eject air toward the substrate, and
wherein the second region comprises an area configured to eject air toward the substrate and suck air between the substrate and the stage.

15. The apparatus of claim 10, wherein the head module includes a nozzle unit configured to discharge the ink toward the substrate, and
wherein a distance in height direction between the stage and the nozzle unit is equal to a distance in height direction between the stage and the displacement sensor.

16. A method of treating a substrate, the method comprising:
providing a stage extending in a first direction and moving a substrate in the first direction;
providing a head module arranged on the stage to be movable in a second direction crossing the first direction;
causing, at a first position, a displacement sensor that is installed in the head module to measure a first separation distance between the substrate and the stage;

causing, at a second position different from the first position, the displacement sensor to measure a second separation distance between the substrate and the stage; and monitoring a difference between the first separation distance and the second separation distance.

17. The method of claim 16, further comprising:

performing maintenance and/or repair of the stage when the first separation distance differs from the second separation distance by a difference that exceeds a preset value.

18. The method of claim 16, further comprising:

causing, at a third position different from the first position and the second position, the displacement sensor to measure a third separation distance between the substrate and the stage.

19. The method of claim 18, further comprising:

monitoring differences between the first separation distance, the second separation distance, and the third separation distance.

20. The method of claim 16, wherein the head module includes a nozzle unit configured to discharge the ink toward the substrate, and wherein a distance in height direction between the stage and the nozzle unit is equal to a distance in height direction between the stage and the displacement sensor.

\* \* \* \* \*